United States Patent
Yasui et al.

(10) Patent No.: US 10,701,850 B2
(45) Date of Patent: Jun. 30, 2020

(54) OPTIMIZATION PROGRAM AND MOUNTING MACHINE

(71) Applicant: FUJI CORPORATION, Chiryu (JP)

(72) Inventors: Yoshihiro Yasui, Nagoya (JP); Hiroyuki Aou, Okazaki (JP); Takeshi Shibabuki, Chiryu (JP)

(73) Assignee: FUJI CORPORATION, Chiryu (JP)

(*) Notice: Subject to any disclaimer, the term of this patent is extended or adjusted under 35 U.S.C. 154(b) by 266 days.

(21) Appl. No.: 15/577,553

(22) PCT Filed: May 29, 2015

(86) PCT No.: PCT/JP2015/065510
§ 371 (c)(1),
(2) Date: Nov. 28, 2017

(87) PCT Pub. No.: WO2016/194030
PCT Pub. Date: Dec. 8, 2016

(65) Prior Publication Data
US 2018/0177085 A1 Jun. 21, 2018

(51) Int. Cl.
*H05K 13/04* (2006.01)
*H05K 13/08* (2006.01)
*G05B 19/18* (2006.01)

(52) U.S. Cl.
CPC .............. *H05K 13/04* (2013.01); *G05B 19/18* (2013.01); *H05K 13/041* (2018.08);
(Continued)

(58) Field of Classification Search
CPC .............. G05B 19/41805; G05B 19/18; H05K 13/0411; H05K 13/0413; H05K 13/0452;
(Continued)

(56) References Cited

U.S. PATENT DOCUMENTS 5,410,801 A * 5/1995 Shiloh ................ H05K 13/0447
29/740
5,862,586 A * 1/1999 Kimura .............. H05K 13/0411
29/832
(Continued)

FOREIGN PATENT DOCUMENTS

EP 1 227 711 A1 7/2002
JP 9-51193 A 2/1997
(Continued)

OTHER PUBLICATIONS

International Search Report dated Sep. 1, 2015, in PCT/JP2015/065510 filed May 29, 2015.
(Continued)

*Primary Examiner* — Carl J Arbes
(74) *Attorney, Agent, or Firm* — Oblon, McClelland, Maier & Neustadt, L.L.P.

(57) ABSTRACT

When a multiple-board printed panel is defined as a panel with multiple boards of electronic circuit board patterns on which multiple electronic components are to be mounted, a work order is set such that electronic components to be held by multiple component holding tools together in one go are electronic components planned to be mounted on one circuit pattern among the multiple circuit patterns. In a case in which one of the electronic circuit board patterns of the multiple electronic circuit board patterns is a defective circuit pattern, because it is not necessary to hold electronic components planned to be mounted on that defective electronic circuit pattern, it is possible to eliminate a back and forth movement between the defective circuit pattern and a supply device of the electronic components, thereby improving throughput when performing mounting work on a multiple-board substrate that includes a defective circuit pattern.

2 Claims, 8 Drawing Sheets

(52) U.S. Cl.
CPC ....... *H05K 13/0452* (2013.01); *H05K 13/085* (2018.08); *H05K 13/0853* (2018.08)

(58) Field of Classification Search
CPC .... H05K 13/084; H05K 13/04; H05K 13/041; H05K 13/13085; H05K 13/0853
See application file for complete search history.

(56) References Cited

U.S. PATENT DOCUMENTS

| | | | |
|---|---|---|---|
| 5,867,586 A * | 2/1999 | Liang | G06K 7/12 283/92 |
| 6,729,018 B1 * | 5/2004 | Takano | H05K 13/0413 29/743 |
| 6,842,974 B1 | 1/2005 | Maenishi et al. | |
| 7,571,539 B2 * | 8/2009 | Maenishi | H05K 13/084 29/834 |
| 2002/0138673 A1 * | 9/2002 | Schaffer | G05B 19/41865 710/28 |
| 2004/0073322 A1 * | 4/2004 | Maenishi | H05K 13/0452 700/28 |
| 2004/0153868 A1 * | 8/2004 | Nonaka | G05B 19/41805 714/47.2 |

FOREIGN PATENT DOCUMENTS

| | | |
|---|---|---|
| JP | 2002-26599 A | 1/2002 |
| JP | 2009-99886 A | 5/2009 |
| JP | 2011-216797 A | 10/2011 |
| JP | 2012-134303 A | 7/2012 |
| WO | WO98/12907 A1 | 3/1998 |

OTHER PUBLICATIONS

Extended European Search Report dated Apr. 23, 2018 in European Patent Application No. 15894065.0 8 pages.

* cited by examiner

OPTIMIZATION PROGRAM AND MOUNTING MACHINE

TECHNICAL FIELD

The present disclosure relates to an optimization program for optimizing mounting work with respect to multiple electronic circuit patterns of a multiple-board printed panel, and to a mounting machine for performing mounting work with respect to multiple electronic circuit patterns of a multiple-board printed panel.

BACKGROUND ART

Among circuit substrates, there are circuit substrates that are provided with multiple boards on one circuit substrate, in which multiple electronic circuit board patterns (hereinafter sometimes referred to as "circuit pattern") on which multiple electronic components are to be mounted are provided; and these multiple-board substrates sometimes include a circuit pattern that is not in good condition (hereinafter sometimes referred to as "defective circuit pattern"). For these multiple-board substrates that include a defective circuit pattern, mounting work to the defective circuit pattern can be skipped during mounting work, and it is desirable to improve throughput of mounter 16 as much as possible. For this, as disclosed in the following patent literature, development has progressed of work procedure settings means for improving throughput when performing mounting work on multiple-board substrates that include a defective circuit pattern.

Patent Literature 1: JP-A-2011-216797
Patent Literature 2: JP-A-2009-99886
Patent Literature 1: JP-A-H9-51193

SUMMARY

According to the technology disclosed in the above patent literature, it is possible to improve to some extent the throughput when performing mounting work on multiple-board substrates that include a defective circuit pattern. However, it is desirable to further improve throughput. The present disclosure takes account of such circumstances and an object thereof is to further improve the throughput when performing mounting work on multiple-board substrates that include a defective circuit pattern.

To solve the above problems, an optimization program according to the present disclosure is an optimization program for optimizing mounting work of mounting electronic components on a multiple-board printed panel using a mounting machine provided with multiple component holding tools, the multiple-board printed panel being defined as a panel with multiple boards of electronic circuit board patterns on which multiple electronic components are to be mounted, the optimization program including: a first setting means configured to set a mounting work order of mounting electronic components by the mounting machine such that electronic components to be held by the multiple component holding tools together in one go are electronic components planned to be mounted on a single one of the electronic circuit board patterns from the multiple electronic circuit board patterns.

Also, to solve the above problems, the mounting machine according to the present disclosure is a mounting machine including: multiple component holding tools; and a control device, wherein the control device, when the mounting machine performs mounting work of mounting electronic components held by the multiple component holding tools onto a multiple-board printed panel, the multiple-board printed panel being defined as a panel with multiple boards of electronic circuit board patterns on which multiple electronic components are to be mounted, performs control such that mounting work is performed according to a first mounting work order of mounting electronic components using the mounting machine set such that electronic components to be held by the multiple component holding tools together in one go are electronic components planned to be mounted on a single one of the electronic circuit board patterns from the multiple electronic circuit board patterns.

With the optimization program and mounting machine according to the present disclosure, a mounting work order is set such that electronic components to be held together in one go by multiple component holding tools are electronic components planned to be mounted on one electronic circuit board pattern of multiple electronic circuit board patterns. By this, for example, in a case in which one of the electronic circuit board patterns of the multiple electronic circuit board patterns is a defective circuit pattern, because it is not necessary to hold electronic components planned to be mounted on that defective electronic circuit pattern, it is possible to eliminate a back and forth movement between the defective circuit pattern and a supply device of the electronic components, thereby improving throughput when performing mounting work on a multiple-board substrate that includes a defective circuit pattern.

DESCRIPTION OF PREFERRED EMBODIMENTS

The following describes in detail referring to the figures an example embodiment of the present disclosure.

Configuration of Electronic Component Mounting Device

Figure 1:
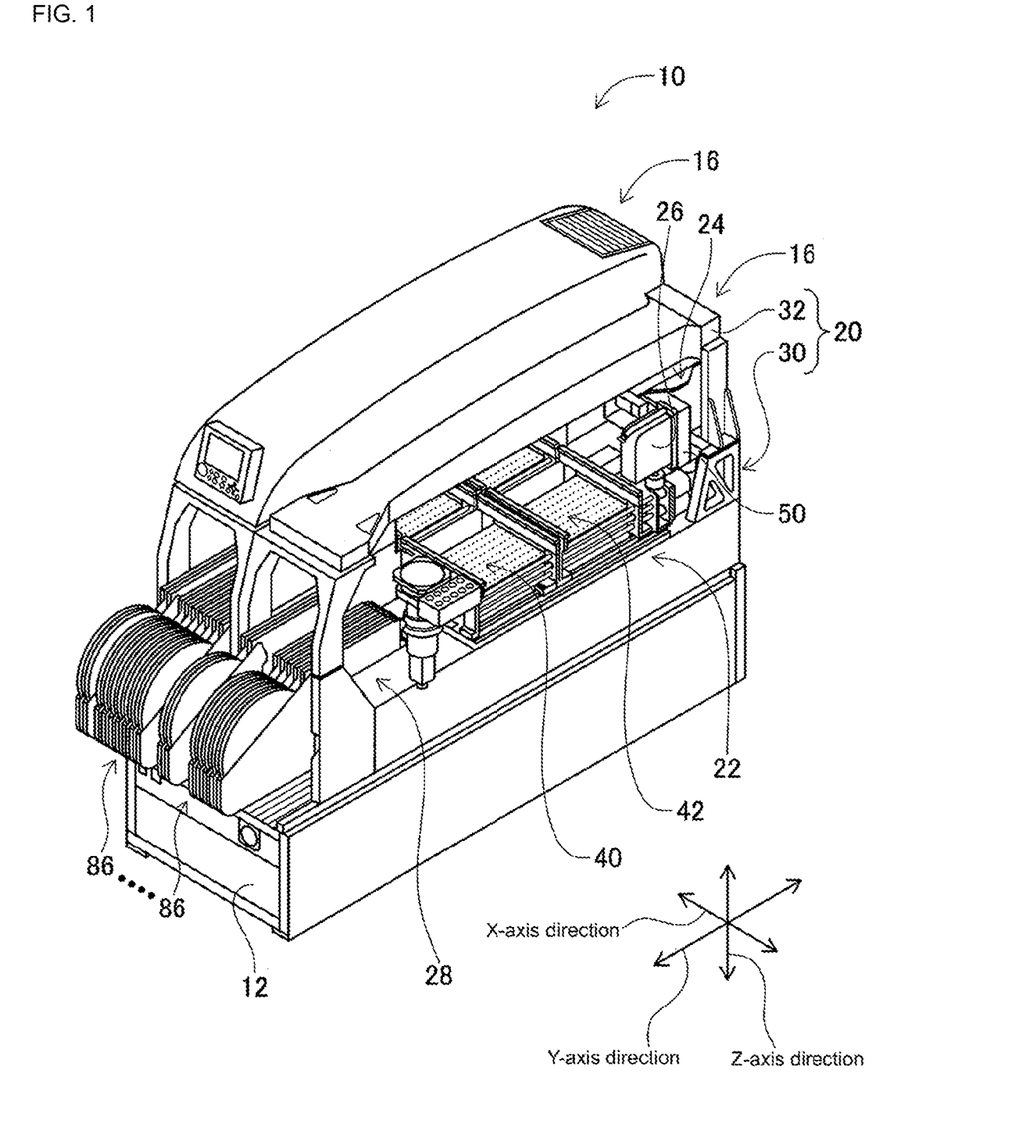
FIG. 1 is a perspective view of an electronic component mounter.

FIG. 1 shows electronic component mounting device 10. Electronic component mounting device 10 includes one system base 12, and two mounting machines 16 that are arranged lined up on system base 12. Note that, in the description below, the direction in which mounting machines 16 are lined up is referred to as the X-axis direction, the direction horizontally perpendicular to the X-axis direction is referred to as the Y-axis direction, and the direction vertically perpendicular to the X-axis direction is referred to as the Z-axis direction.

Each mounter 16 is provided mainly with mounter body 20, conveyance device 22, mounting head moving device (hereinafter in some cases abbreviated to "moving device") 24, mounting head 26, and supply device 28. Mounter body 20 is configured from frame 30 and beam 32 that is mounted on the frame 30.

Conveyance device 22 is provided with two conveyor devices 40 and 42. The two conveyor devices 40 and 42 are parallel to each other and are provided on frame 30 extending in the X-axis direction. Each of the two conveyor devices 40 and 42 conveys circuit substrates held by conveyor device 40 and 42 in the X-axis direction using electromagnetic motor (refer to FIG. 4) 46. Also, the circuit substrate is fixedly held at a predetermined position by substrate holding device (refer to FIG. 4) 48.

Moving device 24 is an XY robot type moving device. Moving device 24 is provided with electromagnetic motor (refer to FIG. 4) 52 for sliding slider 50 in the X-axis direction, and electromagnetic motor (refer to FIG. 4) 54 for sliding slider 50 in the Y-axis direction. Mounting head 26 is attached to slider 50, and mounting head 26 is moved to any position on frame section 30 by operation of the two electromagnetic motors 52 and 54.

Figure 2:
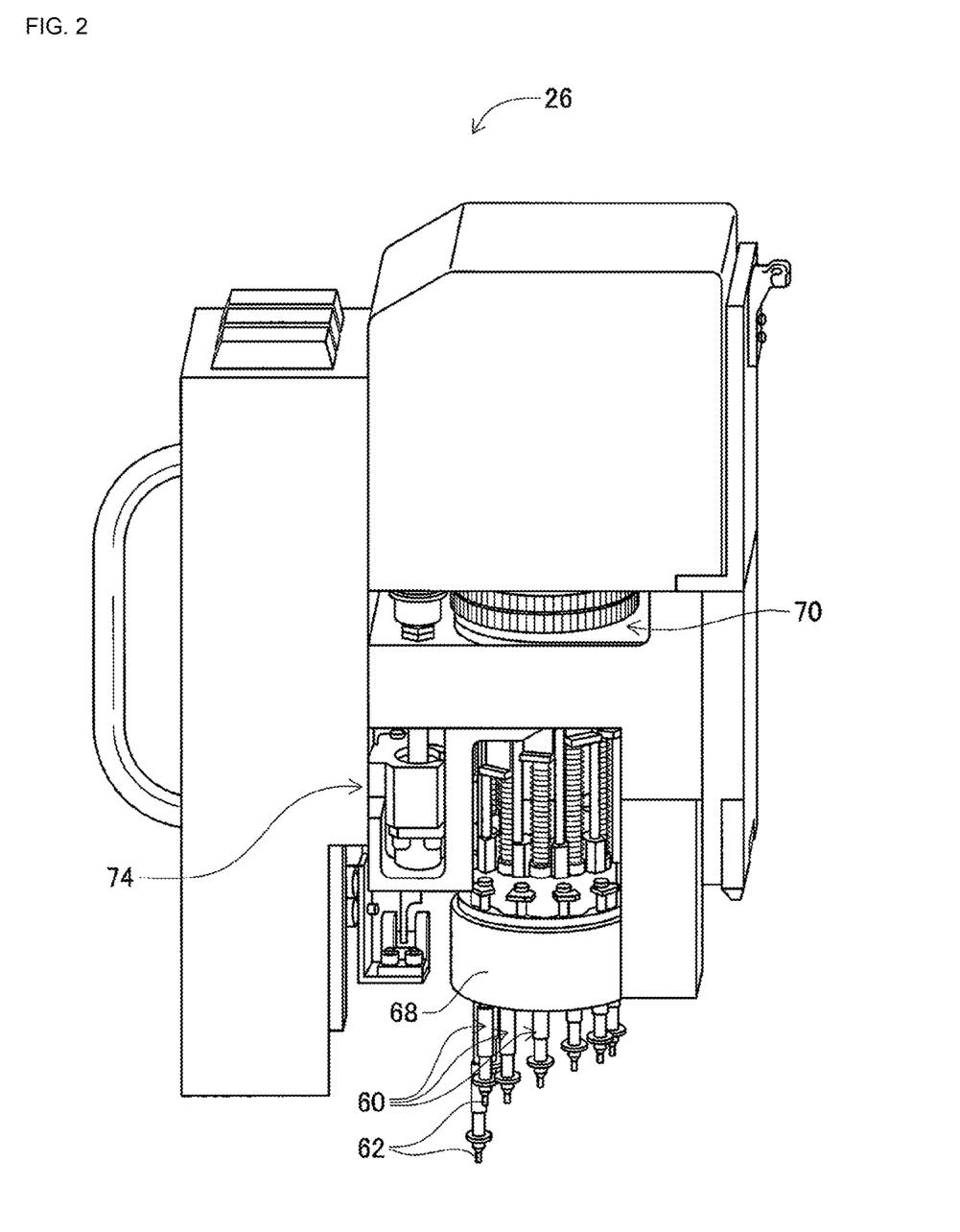
FIG. 2 is a perspective view of a mounting head.
Figure 3:
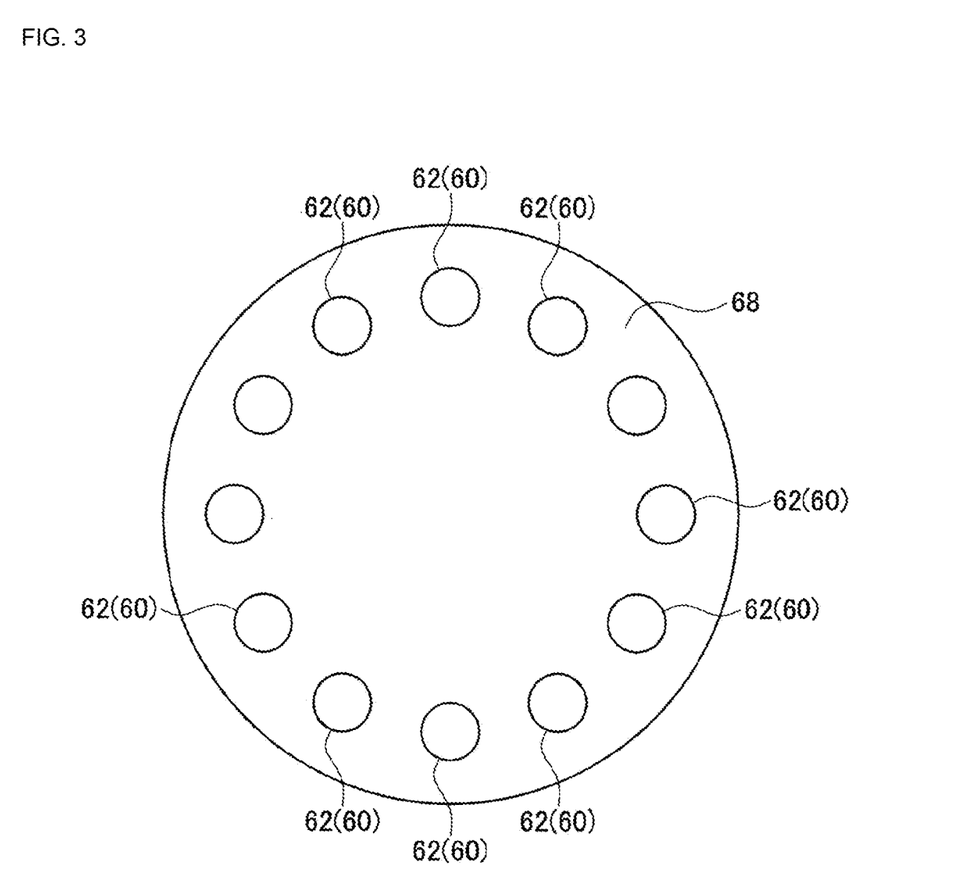
FIG. 3 is a view of the bottom surface of the mounting head.

Mounting head 26 mounts electronic components on a circuit board. As shown in FIGS. 2 and 3, mounting head 26 is provided with twelve rod-shaped mounting units 60, and suction nozzle 62 is attached to an end section of each mounting unit 60. Suction nozzle 62 can be attached to and removed from mounting unit 60, so as to be be changeable based on the size, shape, and so on of an electronic component. Note that, FIG. 2 is a perspective view of mounting head 26 with covers removed, and FIG. 3 is a view of the bottom surface of mounting head 26.

Each suction nozzle 62 is connected to positive/negative pressure supply device (refer to FIG. 4) 66 via a negative air and positive air supply passage. Each suction nozzle 62 picks up and holds an electronic component using negative pressure, and releases the held electronic component using positive pressure. Also, mounting units 60 are held on an outer circumferential section of unit holding body 68 at a uniform pitch. Further, mounting units 60 are held in a state such that an axis direction thereof is upright. Suction nozzle 62 held on the end section of mounting unit 60 extends downwards from the bottom surface of unit holding body 68. Thus, as shown in FIG. 3, the twelve suction nozzles 62 are arranged evenly to create a circle.

Also, unit holding body 68 is intermittently rotated by the arrangement angle of mounting unit 60 each time by electromagnetic motor (refer to FIG. 4) 72 of holding body rotating device 70. Thus, mounting units 60 are stopped sequentially at a raising and lowering station that is one stopping position of the stopping positions of the multiple mounting units 60. Then, mounting unit 60 positioned at the raising and lowering station is raised and lowered by electromagnetic motor (refer to FIG. 4) 76 of unit raising and lowering device 74. By this, the vertical position of the electronic component held by suction nozzle 62 is changed.

Supply device 28 is a feeder type supply device and, as shown in FIG. 1, is provided on the front end of frame section 30. Supply device 28 has tape feeders 86. Tape feeder 86 houses taped components in a wound state. Taped components are electronic components that have been put into tape. Tape feeder 86 feeds the taped components using feeding device (refer to FIG. 4) 88. Accordingly, feeder type supply device 28 supplies an electronic component to a supply position through the feeding delivery of the taped components.

Figure 4:
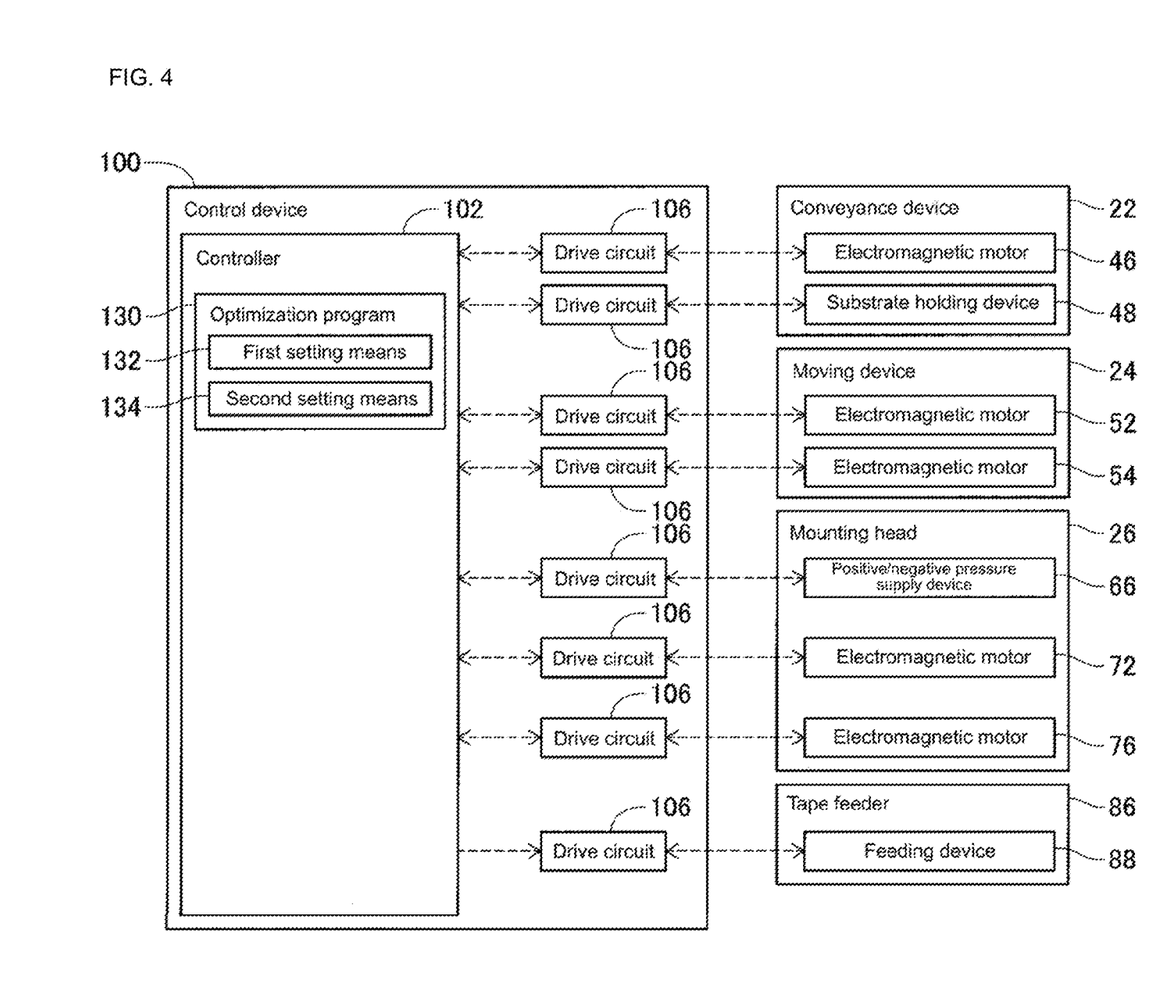
FIG. 4 is a block diagram showing a control device.

As shown in FIG. 4, mounting machine 16 is further provided with control device 100. Control device 100 includes controller 102 and multiple drive circuits 106. The multiple drive circuits 106 are connected to the above electromagnetic motors 46, 52, 54, 72, and 76, substrate holding device 48, positive/negative pressure supply device 66, and feeding device 88. Controller 102 is provided with a CPU, ROM, RAM, and so on, is formed mainly from a computer, and is connected to the multiple drive circuits 106. By this, operation of conveyance device 22, moving device 24, and so on is controlled by controller 102.

Mounting Work by a Mounter

It is possible to perform mounting work with respect to a circuit substrate held in conveyance device 22 using mounting head 26 in mounting machine 16 with the above configuration. Specifically, based on commands of controller 102, a circuit substrate is conveyed to a work position, and fixedly held at that position by substrate holding device 48. Also, tape feeder 86, based on commands of controller 102, feeds taped components to supply an electronic component to a supply position. Then, mounting head 22, based on commands of controller 102, moves above the supply position of the electronic component and picks up and holds the electronic component using suction nozzle 62. Continuing, mounting head 26, based on commands of controller 102, moves above the circuit substrate and mounts the held electronic component on the circuit substrate.

Setting the mounting work order for a multiple-board substrate with mounting machine 16, mounting work with respect to the circuit substrate is performed according to the above procedure, and because multiple electronic components are mounted on the circuit substrate, a work order of the mounting work of mounting multiple electronic components on the circuit substrate is set. Described below is a work procedure when a circuit substrate being produced is a multiple-board substrate. Multiple-board substrates are provided with multiple boards on one circuit substrate, in which multiple electronic circuit board patterns (hereinafter also referred to as "circuit pattern") on which multiple electronic components are to be mounted are provided; specifically, for example, on multiple-board substrate 110 shown in FIG. 5, there are three circuit patterns 112. Each circuit pattern 112 is rectangular, and three circuit patterns 112 are arranged lined up in one row vertically. Sixteen electronic components 114, 116, and 118 are to be mounted onto each circuit pattern 112. Note that, to distinguish between the three circuit patterns 112, they are sometimes referred to as first circuit pattern 112a, second circuit pattern 112b, and third circuit pattern 112c. Also, electronic components planned to be mounted onto first circuit pattern 112a are sometimes referred to as electronic components 114a to 114p, electronic components planned to be mounted onto second circuit pattern 112b are sometimes referred to as electronic components 116a to 116p, and electronic components planned to be mounted onto third circuit pattern 112c are sometimes referred to as electronic components 118a to 118p.

Figure 5:
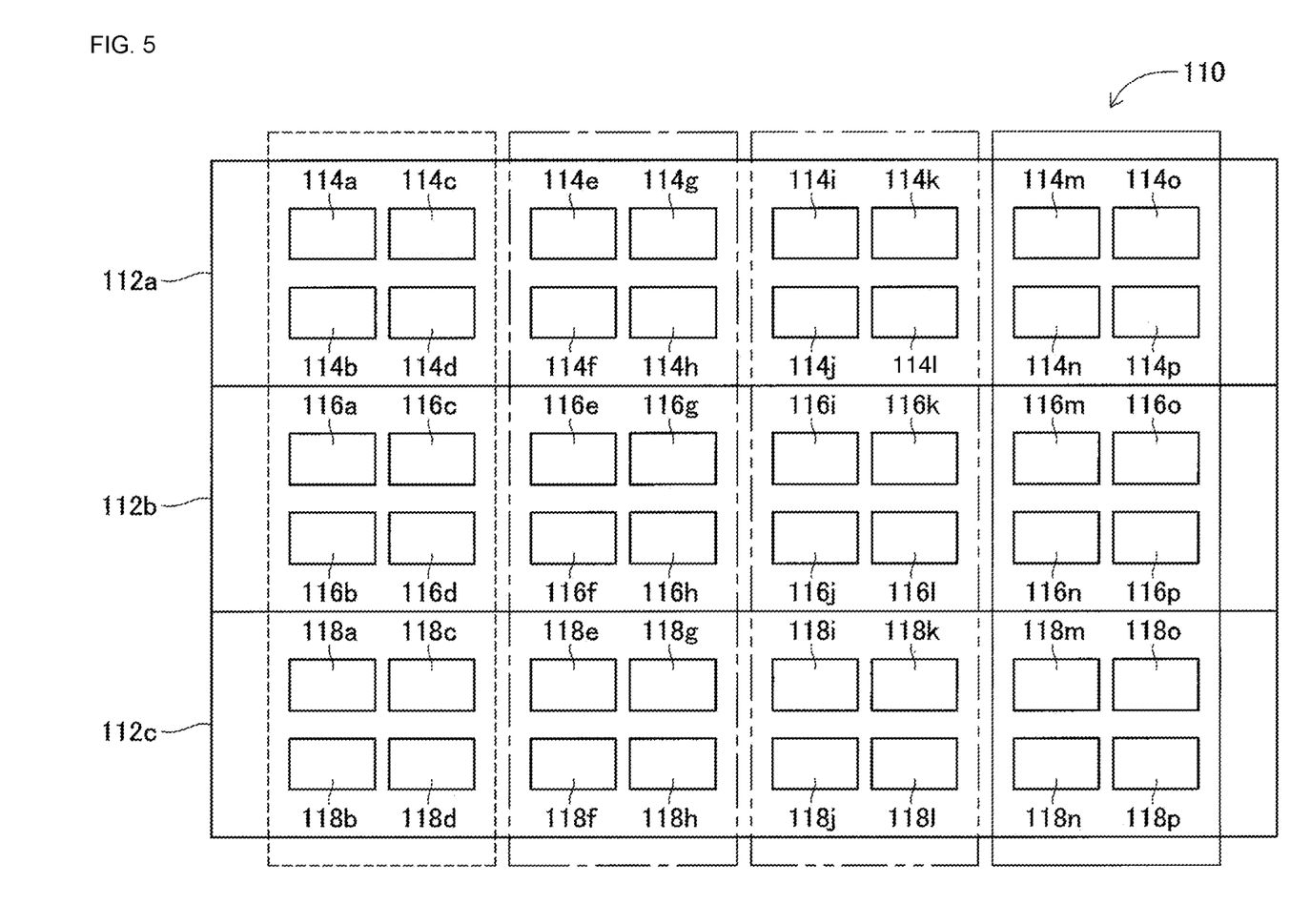
FIG. 5 is a plan view of a multiple-board substrate.

Described first is a conventional method for setting the work order of mounting work with respect to multiple-board substrate 110. Because mounting machine 16 is provided with mounting head 26 to which twelve suction nozzles 62 are attached, twelve electronic components are held together in one go, and those twelve electronic components are mounted on the circuit substrate sequentially. Thus, the work order is set such that twelve electronic components, the four electronic components 114a to 114d of first circuit pattern 112a, the four electronic components 116a to 116d of second circuit pattern 112b, and the four electronic components 118a to 118d of third circuit pattern 112c, are held by mounting head 26 together in one go. Further, the work order is set such that twelve electronic components, the four electronic components 114e to 114h of first circuit pattern 112a, the four electronic components 116e to 116h of second circuit pattern 112b, and the four electronic components 118e to 118h of third circuit pattern 112c, are held by mounting head 26 together in one go. And, the work order is set such that twelve electronic components, the four electronic components 114*i* to 114*i* of first circuit pattern 112*a*, the four electronic components 116*i* to 116*l* of second circuit pattern 112*b*, and the four electronic components 118*i* to 118*l* of third circuit pattern 112*c*, are held by mounting head 26 together in one go. Also, the work order is set such that twelve electronic components, the four electronic components 114*m* to 114*p* of first circuit pattern 112*a*, the four electronic components 116*m* to 116*p* of second circuit pattern 112*b*, and the four electronic components 118*m* to 118*p* of third circuit pattern 112*c*, are held by mounting head 26 together in one go.

That is, the work order is set such that electronic components 114, 116, and 118 surrounded by the dashed line, electronic components 114, 116, and 118 surrounded by the single-dashed line, electronic components 114, 116, and 118 surrounded by the two-dashed line, and electronic components 114, 116, and 118 surrounded by the thin solid line are held by mounting head 26 together in one go. In this manner, by setting the work order such that multiple electronic components close to the mounting work position are held together in one go by mounting head 26, and then mounting work of those multiple electronic components is performed sequentially, it is possible to reduce the moving range of mounting head 26 and thus to improve throughput.

However, there are cases in which one of the circuit patterns of the three circuit patterns 112 of multiple-board substrate 110 is defective. In this case, mounting work is not performed with respect to the defective circuit pattern (hereinafter sometimes referred to as "defective circuit pattern"). That is, for example, in a case in which second circuit pattern 112*b* is a defective circuit pattern, mounting work of mounting electronic components 116*a* to 116*p* on second circuit pattern 112*b* is not performed. Therefore, in a case in which the work order is set using a conventional method, from among the electronic components 114, 116, and 118 surrounded by the dashed line, single-dashed line, two-dashed line, and thin solid line, electronic components 116 are not held by mounting head 26, and only mounting work of electronic components 114 and 118 is performed. That is, even though mounting head 26 is capable of holding twelve electronic components together in one go, in a case in which one of the circuit patterns is a defective circuit pattern, only eight electronic components are held together in one go, and four suction nozzles 62 do not hold an electronic component. That is, when performing mounting work with respect to multiple-board substrate 110, because it is necessary to perform mounting work of electronic components 114, 116, and 118 surrounded by each of the dashed line, single-dashed line, two-dashed line, and thin solid line, mounting head 26 moves back and forth between multiple-board substrate 110 and supply device 28 four times, and each time mounting head 26 moves, four suction nozzles 62 are not holding an electronic component. This is extremely inefficient, and throughput is barely improved.

Figure 6:
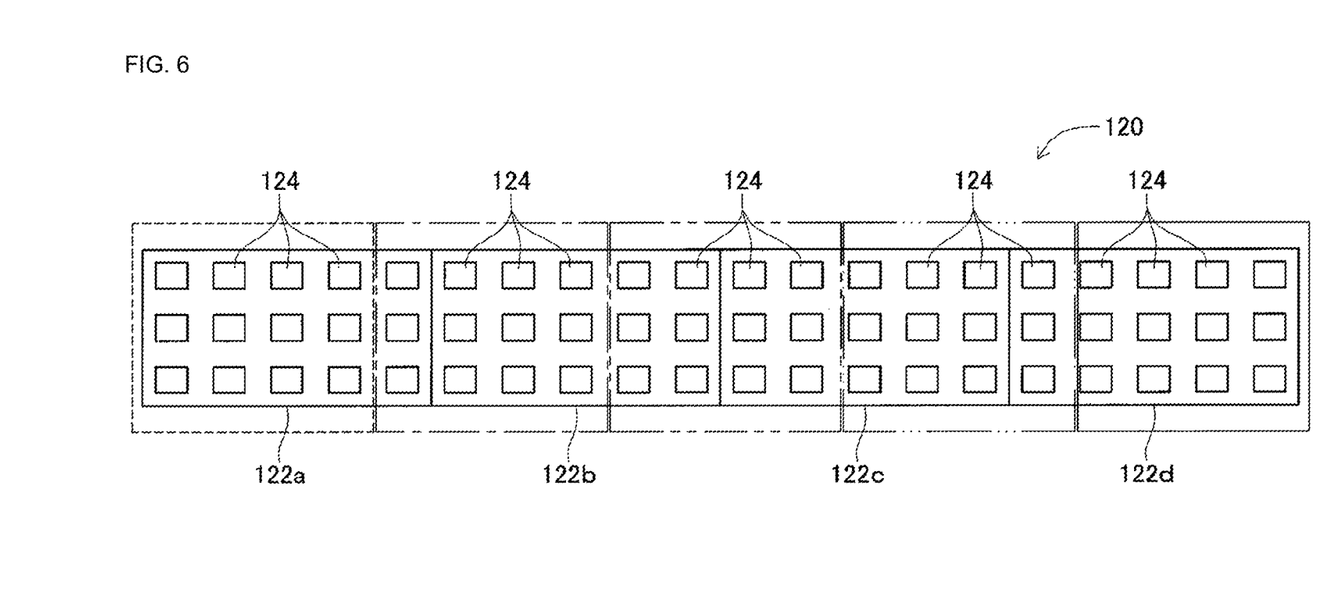
FIG. 6 is a plan view of a multiple-board substrate.

Also, for example, on multiple-board substrate 120 shown in FIG. 6, four circuit patterns 122 are arranged lined up in one row horizontally. Further, on each of the circuit patterns 122, fifteen electronic components 124 are mounted lined up in a 3×5 pattern. Note that, to distinguish between the four circuit patterns 122, they are sometimes referred to as first circuit pattern 122*a*, second circuit pattern 122*b*, third circuit pattern 122*c*, and fourth circuit pattern 122*d*.

Conventionally, when setting a work order for mounting work with respect to such a multiple-board substrate 120, the work order is set such that twelve electronic components 124 of the first to fourth rows of first circuit pattern 122*a* are held together in one go. Further, the work order is set such that twelve electronic components 124 consisting of the electronic components 124 of the fifth row of first circuit pattern 122*a* and the electronic components 124 of the first to third rows of second circuit pattern 122*b* are held by mounting head 26 together in one go. Further, the work order is set such that twelve electronic components 124 consisting of the electronic components 124 of the fourth and fifth rows of second circuit pattern 122*b* and the electronic components 124 of the first and second rows of third circuit pattern 122*c* are held by mounting head 26 together in one go. Further, the work order is set such that twelve electronic components 124 consisting of the electronic components 124 of the third to fifth rows of third circuit pattern 122*c* and the electronic components 124 of the first row of fourth circuit pattern 122*d* are held by mounting head 26 together in one go. And, a work order is set such that twelve electronic components 124 consisting of the electronic components 124 of the second to fifth rows of fourth circuit pattern 122*d* are held by mounting head 26 together in one go.

That is, a work order is set such that electronic components 124 of first circuit pattern 122*a* and second circuit pattern 122*b* surrounded by the dashed line, electronic components 124 of second circuit pattern 122*b* and third circuit pattern 122*c* surrounded by the single-dashed line, electronic components 124 of third circuit pattern 122*c* and fourth circuit pattern 122*d* surrounded by the two-dashed line, electronic components 124 of fourth circuit pattern 122*d* and fifth circuit pattern 122*e* surrounded by the three-dotted line, and electronic components 124 of fifth circuit pattern 122*e* surrounded by the thin solid line are respectively held together in one go by mounting head 26. In this manner, for multiple-board substrate 120 too, in a similar manner as for multiple-board substrate 110, by setting the work order such that multiple electronic components close to the mounting work position are held by mounting head 26 together in one go, and then mounting work of those multiple electronic components is performed sequentially, it is possible to reduce the moving range of mounting head 26 and thus to improve throughput.

However, for example, in a case in which second circuit pattern 122*b* is a defective circuit pattern, mounting work of mounting the fifteen electronic components 124 on second circuit pattern 122*b* is not performed. Therefore, in a case in which a work order is set using a conventional method, the nine electronic components 124 of second circuit pattern 122 from among the electronic components 124 surrounded by the single-dashed line are not held by mounting head 26, and mounting work is only performed for the three electronic components 124 of first circuit pattern 122*a* surrounded by the single-dashed line. Also, the six electronic components 124 of second circuit pattern 122 from among the electronic components 124 surrounded by the two-dashed line are not held by mounting head 26, and mounting work is only performed for the six electronic components 124 of third circuit pattern 122*c* surrounded by the two-dashed line. That is, even though mounting head 26 is capable of holding twelve electronic components together in one go, when performing mounting work of mounting electronic components 124 surrounded by the single-dashed line, nine suction nozzles 62 do not hold an electronic component, and when performing mounting work of mounting electronic components 124 surrounded by the two-dashed line, six suction nozzles 62 do not hold an electronic component. This is extremely inefficient, and throughput is barely improved.

Figure 7:
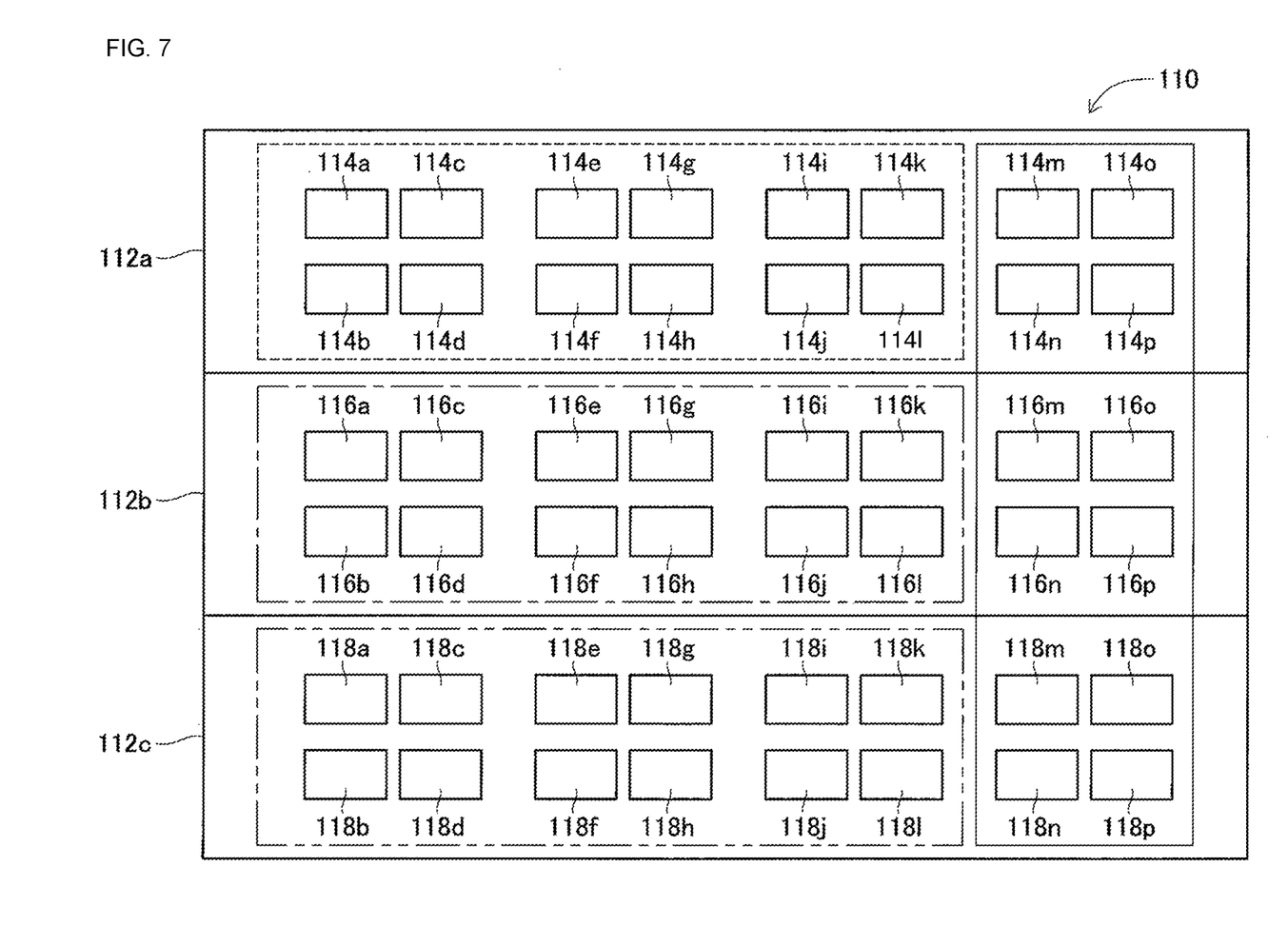
FIG. 7 is a plan view of a multiple-board substrate.

Considering such circumstances, with mounting machine 16, a work order is set such that electronic components planned to be mounted on one of the circuit patterns of the multiple circuit patterns are held by mounting head 26 together in one go. Specifically, as shown in FIG. 7, with multiple-board substrate 110, a work order is set such that the twelve electronic components 114a to 114l of first circuit pattern 112a are held by mounting head 26 together in one go, a work order is set such that the twelve electronic components 116a to 116l of the second circuit pattern 112b are held by mounting head 26 together in one go, and a work order is set such that the twelve electronic components 118a to 118l of the third circuit pattern 112c are held by mounting head 26 together in one go. That is, work orders are set such that electronic components 114a to 114l surrounded by the dashed line, electronic components 116a to 116l surrounded by the single-dashed line, and electronic components 118a to 118l surrounded by the two-dashed line are respectively held by mounting head 26 together in one go.

Also, a work order is set such that electronic components of each circuit pattern 112 not set in the previous work orders, that is, the twelve electronic components consisting of the four electronic components 114m to 114p of the first circuit pattern 112a, the four electronic components 116m to 116p of the second circuit pattern 112b, and the four electronic components 118m to 118p of the third circuit pattern 112c are held by mounting head 26 together in one go. That is, a work order is set such that the electronic components surrounded by the thin solid line are held by mounting head 26 together in one go.

When performing mounting work according to work orders set as above, for example, in a case in which the second circuit pattern 112b is a defective circuit pattern, because mounting work with respect to the second circuit pattern 112b is not required, mounting head 26 does not have to hold the twelve electronic components 116a to 116l surrounded by the single-dashed line. Therefore, it is not necessary to move back and forth between multiple-board substrate 110 and supply device 28 in order to pick up and hold the twelve electronic components 116a to 116l surrounded by the single-dashed line from supply device 28. On the other hand, mounting work is performed such that all of the suction nozzles 62 of mounting head 26 hold the twelve electronic components 114a to 114l surrounded by the dashed line. Also, mounting work is performed with all of the suction nozzles 62 of mounting head 26 holding the twelve electronic components 118a to 118l surrounded by the two-dashed line. Also, the four electronic components of second circuit pattern 112b from among the twelve electronic components surrounded by the thin solid line are not held by mounting head 26, and mounting work is only performed for the eight electronic components of the first circuit pattern 112a and the third circuit pattern 112c surrounded by the thin solid line. In such a manner, when a work order is set as given above, during mounting work, the quantity of suction nozzles 62 not holding an electronic component is reduced, thereby improving work efficiency. Also, moving back and forth between multiple-board substrate 110 and supply device 28 can be reduced by one time. Thus, by setting a work order as given above, throughput can be improved when there is a defective circuit pattern.

Figure 8:
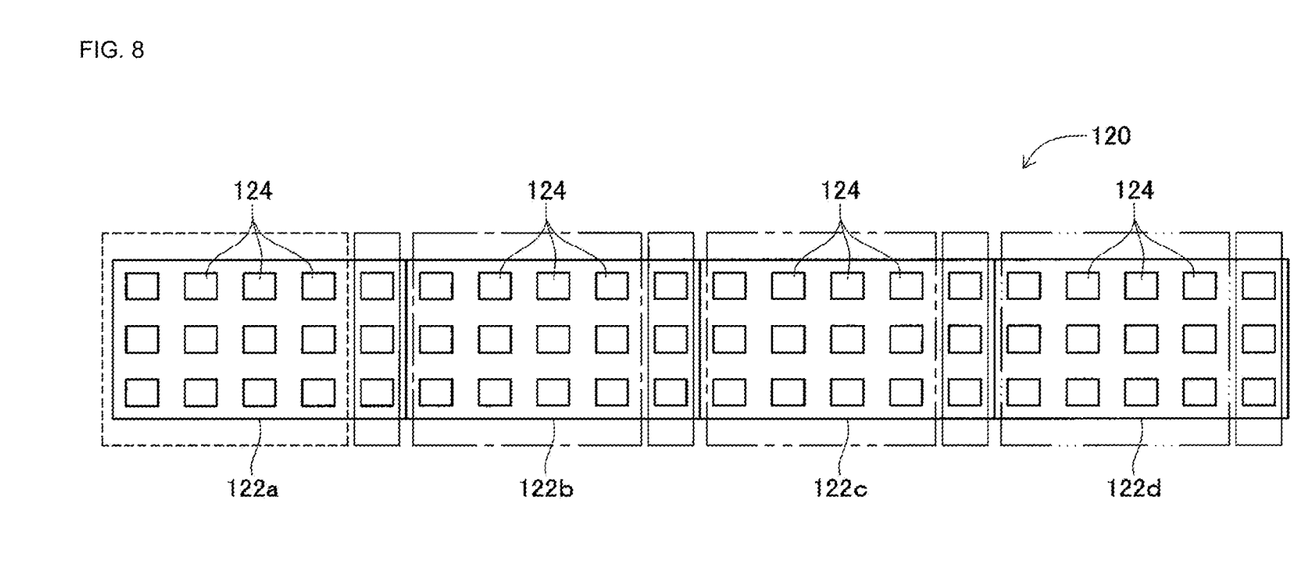
FIG. 8 is a plan view of a multiple-board substrate.

Also, as shown in FIG. 8, with multiple-board substrate 120, a work order is set such that the twelve electronic components 124 in the first to fourth rows of each circuit pattern 122 are held by mounting head 26 together in one go. That is, a work order is set such that the twelve electronic components 124 of the first to fourth rows of the first circuit pattern 122a surrounded by the dashed line, the twelve electronic components 124 of the first to fourth rows of the second circuit pattern 122b surrounded by the single-dashed line, the twelve electronic components 124 of the first to fourth rows of the third circuit pattern 122c surrounded by the two-dashed line, the twelve electronic components 124 of the first to fourth rows of the fourth circuit pattern 122d surrounded by the three-dotted line, are respectively held by mounting head 26 together in one go.

Also, a work order is set such that electronic components not set the previous work orders, that is, the twelve electronic components 124 consisting of the three electronic components 124 in the fifth row of first circuit pattern 122a, the three electronic components 124 in the fifth row of second circuit pattern 122b, the three electronic components 124 in the fifth row of third circuit pattern 122c, and the three electronic components 124 in the fifth row of fourth circuit pattern 122d, are held by mounting head 26 together in one go. That is, a work order is set such that the electronic components surrounded by the thin solid line are held by mounting head 26 together in one go.

When performing mounting work according to work orders set as above, for example, in a case in which the second circuit pattern 122b is a defective circuit pattern, because mounting work with respect to the second circuit pattern 122b is not required, mounting head 26 does not have to hold the twelve electronic components 124 surrounded by the single-dashed line. Therefore, it is not necessary to move back and forth between multiple-board substrate 110 and supply device 28 in order to pick up and hold the electronic components 124 surrounded by the single-dashed line from supply device 28. On the other hand, mounting work is performed such that all of the suction nozzles 62 of mounting head 26 hold the respective twelve electronic components 124 surrounded by the dashed line, the twelve electronic components 124 surrounded by the single-dashed line, and the twelve electronic components 124 surrounded by the two-dashed line. Also, the three electronic components of second circuit pattern 122b from among the twelve electronic components surrounded by the thin solid line are not held by mounting head 26, and mounting work is only performed for the nine electronic components of the first circuit pattern 122a, the third circuit pattern 122c, and the fourth circuit pattern 122d surrounded by the thin solid line. In such a manner, when a work order is set as given above, during mounting work, the quantity of suction nozzles 62 not holding an electronic component is reduced, thereby improving work efficiency. Also, moving back and forth between multiple-board substrate 120 and supply device 28 can be reduced by one time. Thus, by setting a work order as given above, throughput can be improved when there is a defective circuit pattern.

Note that, the above setting of work orders is performed by optimization program (refer to FIG. 4) 130 memorized in controller 102. Note that, as shown in FIG. 4, optimization program 130 includes first setting means 132 and second setting means 134. First setting means 132 is a functional section for setting a work order such that electronic components planned to be mounted on one circuit pattern among multiple circuit patterns are held by mounting head 26 together in one go. Second setting means 134 is a functional section for setting a work order such that electronic components of two or more circuit patterns not set by the first setting means are held by mounting head 26 together in one go.

Note that, in an embodiment above, mounting machine 16 is an example of a mounting work machine. Suction nozzle 62 is an example of a component holding tool. Control device 100 is an example of a control device. Multiple-board substrate 110 is an example of a multiple-board printed panel. Circuit pattern 112 is an example of an electronic circuit board pattern. Electronic components 114, 116, and 118 are examples of an electronic component. Multiple-board substrate 120 is an example of a multiple-board printed panel. Circuit pattern 122 is an example of an electronic circuit board pattern. Electronic component 124 is an example of an electronic component. Optimization program 130 is an example of an optimization program. First setting means 132 is an example of a first setting means. Second setting means 134 is an example of a second setting means.

Further, the present disclosure is not limited to the above example embodiments, and various changed or improved methods of embodiment are possible based on the knowledge of someone skilled in the art. Specifically, for example, in the above embodiment, optimization program 130 is provided in control device 100 and control device 100 performs setting of work orders, however, optimization program 130 may be provided in a device different to control device 100, and setting of work orders may be performed by the different device.

REFERENCE SIGNS LIST

16: mounting machine (mounting work machine); 62: suction nozzle (component mounting tool); 100: control device; 110: multiple-board substrate (multiple-board printed panel); 112: circuit pattern (electronic circuit board pattern); 114: electronic circuit; 116: electronic component; 118: electronic component; 122: multiple-board substrate (multiple-board printed panel); 122: circuit pattern (electronic circuit board pattern); 124: electronic component; 130; optimization program; 132: first setting means; 134: second setting means

The invention claimed is:

1. An optimization method for optimizing mounting work of mounting electronic components on a multiple-board printed panel using a mounting machine provided with multiple component holding tools, the multiple-board printed panel being defined as a panel with multiple boards of electronic circuit board patterns on which multiple electronic components are to be mounted, the optimization method comprising:
   a first setting of setting a first mounting work order of mounting electronic components by the mounting machine such that all of the electronic components to be held by the multiple component holding tools together in a single movement of the multiple component holding tools are only electronic components planned to be mounted on only a single one of the electronic circuit board patterns from the multiple electronic circuit board patterns;
   performing mounting work based on the first mounting work order; and
   a second setting of setting a second mounting work order of mounting the electronic components by the mounting machine such that, in a case in which, after the first mounting work order of the electronic components is set by the first setting, a quantity of the electronic components not set in the first mounting work order of the electronic components set by the first setting from among all the electronic components planned to be mounted on the electronic circuit board pattern is smaller than a quantity of the multiple component holding tools, electronic components to be held by the multiple component holding tools together in a single movement of the multiple component holding tools are electronic components of two or greater electronic circuit board patterns from the multiple electronic circuit board patterns that were not set in the first mounting work order of the electronic components set by the first setting.

2. A mounting machine comprising:
multiple component holding tools; and
a control device,
wherein
the control device, when the mounting machine performs mounting work of mounting electronic components held by the multiple component holding tools onto a multiple-board printed panel, the multiple-board printed panel being defined as a panel with multiple boards of electronic circuit board patterns on which multiple electronic components are to be mounted, performs control such that
mounting work is performed according to a first mounting work order of mounting electronic components using the mounting machine set such that all of the electronic components to be held by the multiple component holding tools together in a single movement of the multiple component holding tools are only electronic components planned to be mounted on only a single one of the electronic circuit board patterns from the multiple electronic circuit board patterns, and
the control device also controls operation of the mounting machine such that, in a case in which, after mounting work has been performed according to the first mounting work order, a quantity of the electronic components not set in the mounting work order according to the first mounting work order from among all the electronic components planned to be mounted on the electronic circuit board pattern is smaller than a quantity of the multiple component holding tools, electronic components to be held by the multiple component holding tools together in a single movement of the multiple component holding tools are electronic components of two or greater electronic circuit board patterns from the multiple electronic circuit board patterns that were not set in the mounting work according to the first mounting work order.

* * * * *